(12) United States Patent
Huang et al.

(10) Patent No.: US 9,525,113 B2
(45) Date of Patent: Dec. 20, 2016

(54) METHOD OF MANUFACTURING A LED PACKAGE STRUCTURE FOR PREVENTING LATERAL LIGHT LEAKAGE

(71) Applicants: BRIGHTEK OPTOELECTRONIC (SHENZHEN) CO., LTD., Shenzhen (CN); BRIGHTEK OPTOELECTRONIC CO., LTD., Taoyuan County (TW)

(72) Inventors: Chien-Chung Huang, Taoyuan County (TW); Chih-Ming Wu, Taoyuan County (TW); Tung Po Huang, Taoyuan County (TW)

(73) Assignees: BRIGHTEK OPTOELECTRONIC (SHENZHEN) CO., LTD., Shenzhen (CN); BRIGHTEK OPTOELECTRONIC CO., LTD., Taoyuan County (TW)

( * ) Notice: Subject to any disclaimer, the term of this patent is extended or adjusted under 35 U.S.C. 154(b) by 0 days.

(21) Appl. No.: 14/804,448

(22) Filed: Jul. 21, 2015

(65) Prior Publication Data

US 2016/0087168 A1    Mar. 24, 2016

Related U.S. Application Data

(62) Division of application No. 14/490,212, filed on Sep. 18, 2014, now Pat. No. 9,236,541.

(51) Int. Cl.
*H01L 33/54* (2010.01)
*H01L 25/075* (2006.01)
(Continued)

(52) U.S. Cl.
CPC ............. *H01L 33/54* (2013.01); *H01L 24/97* (2013.01); *H01L 25/0753* (2013.01);
(Continued)

(58) Field of Classification Search
CPC .................. H01L 27/14618; H01L 27/14683; H01L 31/0203; H01L 2924/01079; H01L 2924/01378
(Continued)

(56) References Cited

U.S. PATENT DOCUMENTS 8,969,842 B2 *    3/2015   Minamikawa ........ H01L 25/167
                                                                    250/221

FOREIGN PATENT DOCUMENTS

CN          101735796 A       6/2010
CN          201673932 U       12/2010
(Continued)

*Primary Examiner* — Quoc Hoang
(74) *Attorney, Agent, or Firm* — Li & Cai Intellectual Property (USA) Office (57) ABSTRACT

A method of manufacturing a LED package structure for preventing lateral light leakage includes placing a plurality of light-emitting units on a carrier substrate, the light-emitting units being electrically connected to the carrier substrate; forming a plurality of light-transmitting gel bodies on the carrier substrate for respectively enclosing the light-emitting units, the light-transmitting gel bodies being separated from each other to form a gel receiving space among the light-transmitting gel bodies; forming a light-shielding gel body to fill up the gel receiving space; and then cutting the carrier substrate and the light-shielding gel body to form the plurality of LED package structures separated from each other, the carrier substrate being cut to form a plurality of circuit substrates for respectively carrying the light-emitting units.

8 Claims, 12 Drawing Sheets

(51) Int. Cl.
    *H01L 33/00*     (2010.01)
    *H01L 33/58*     (2010.01)
    *H01L 27/15*     (2006.01)
    *H01L 33/50*     (2010.01)
    *H01L 23/00*     (2006.01)
    *H01L 33/62*     (2010.01)
    *H01L 33/60*     (2010.01)

(52) U.S. Cl.
    CPC ........ *H01L 27/153* (2013.01); *H01L 33/0095* (2013.01); *H01L 33/50* (2013.01); *H01L 33/507* (2013.01); *H01L 33/58* (2013.01); *H01L 33/62* (2013.01); *H01L 33/505* (2013.01); *H01L 33/60* (2013.01); *H01L 2224/48091* (2013.01); *H01L 2224/48227* (2013.01); *H01L 2924/0002* (2013.01); *H01L 2924/181* (2013.01); *H01L 2924/1815* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01); *H01L 2933/0091* (2013.01)

(58) Field of Classification Search
    USPC ...................................... 438/67, 68, 113, 116
    See application file for complete search history.

(56) References Cited

FOREIGN PATENT DOCUMENTS

| | | |
|---|---|---|
| CN | 104103746 A | 10/2014 |
| JP | 2002198558 A | 7/2002 |

\* cited by examiner

METHOD OF MANUFACTURING A LED PACKAGE STRUCTURE FOR PREVENTING LATERAL LIGHT LEAKAGE

CROSS REFERENCE TO RELATED APPLICATIONS

This application is a divisional application of Ser. No. 14/490,212 filed on Sep. 18, 2014, and entitled "LED PACKAGE STRUCTURE FOR PREVENTING LATERAL LIGHT LEAKAGE AND METHOD OF MANUFACTURING THE SAME", now pending, the entire disclosures of which are incorporated herein by reference.

BACKGROUND OF THE INVENTION

1. Field of the Invention

The instant disclosure relates to a method of manufacturing a LED package structure, and more particularly to a method of manufacturing a LED package structure for preventing lateral light leakage.

2. Description of Related Art

Recently, with rapid development of information technology industry, a portable electronic device, such as a notebook computer, a smart phone and so on, can be used in various circumstances. As for using a notebook computer in the dark circumstances, it is hard for a user to operate a keyboard since characters marked on the keyswitch might not be visible. Moreover, it might damage the user's sight during the process of using the notebook computer in the dark circumstances. In the prior art, a specific keyswitch equipped with indication light can improve the aforementioned problem. In addition, by various disposals of specific keyswitch equipped with indication light, it makes the portable electronic device equipped with the specific keyboard be able to have different visual effects, so as to enhance the market.

In the prior art, a base plate module of the keyboard with the specific keyswitch capable of emitting indication light includes a circuit board, a light source and a mylar. The light source is disposed on the circuit board, and the mylar covers the light source and the circuit board. In addition, a hole is formed on the mylar and located in a position corresponding to the light source. The keyswitch module is disposed on the mylar, and a keycap of the keyswitch module includes a transparent structure located in a position corresponding to the hole. Accordingly, light emitted from the light source can pass through the hole on the mylar and the transparent structure of the keycap, so as to be detected by the user.

SUMMARY OF THE INVENTION

One aspect of the instant disclosure relates to a method of manufacturing a LED package structure for preventing lateral light leakage.

One of the embodiments of the instant disclosure provides a method of manufacturing a LED package structure for preventing lateral light leakage, comprising: placing a plurality of light-emitting units on a carrier substrate, wherein the light-emitting units are electrically connected to the carrier substrate; forming a plurality of light-transmitting gel bodies on the carrier substrate for respectively enclosing the light-emitting units, wherein the light-transmitting gel bodies are separated from each other to form a gel receiving space among the light-transmitting gel bodies; forming a light-shielding gel body to fill up the gel receiving space; and then cutting the carrier substrate and the light-shielding gel body to form the plurality of LED package structures separated from each other, wherein the carrier substrate is cut to form a plurality of circuit substrates for respectively carrying the light-emitting units.

Another one of the embodiments of the instant disclosure provides a method of manufacturing a LED package structure for preventing lateral light leakage, comprising: placing a plurality of light-emitting units on a carrier substrate, wherein the light-emitting units are electrically connected to the carrier substrate; forming a light-transmitting layer on the carrier substrate for enclosing the light-emitting units; cutting the light-transmitting layer to form a plurality of light-transmitting gel bodies, wherein the light-transmitting gel bodies are disposed on the carrier substrate for respectively enclosing the light-emitting units, and the light-transmitting gel bodies are separated from each other to form a gel receiving space among the light-transmitting gel bodies; forming a light-shielding gel body to fill up the gel receiving space; and then cutting the carrier substrate and the light-shielding gel body to form the plurality of LED package structures separated from each other, wherein the carrier substrate is cut to form a plurality of circuit substrates for respectively carrying the light-emitting units.

More precisely, the first light-transmitting portion is a first column body disposed on the corresponding circuit substrate for enclosing the at least one LED chip of the corresponding light-emitting unit, the at least one second light-transmitting portion is a second column body integrally and upwardly projected from the first light-transmitting portion and disposed right above the at least one LED chip of the corresponding light-emitting unit, and the diameter of the at least one second light-transmitting portion is increased or decreased gradually along a direction from the first light-transmitting portion to the light output surface of the at least one second light-transmitting portion.

More precisely, the circuit substrate has an outer perimeter, the light-shielding gel body has an outer perimeter, and the outer perimeter surface of the circuit substrate is substantially flush with the outer perimeter surface of the light-shielding gel body, wherein the light-transmitting gel body is formed by a transparent material only or by uniformly mixing the transparent material with phosphor particles and diffusion particles.

Therefore, the instant disclosure can provide a method of manufacturing a LED package structure for preventing lateral light leakage due to the design of "the light-shielding gel body disposed on the circuit substrate for exposing the light output surface of the at least one second light-transmitting portion" or "the light-shielding gel body disposed on the circuit substrate for exposing the light output surface of each second light-transmitting portion".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "a LED package structure for preventing lateral light leakage and a method of manufacturing the same" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
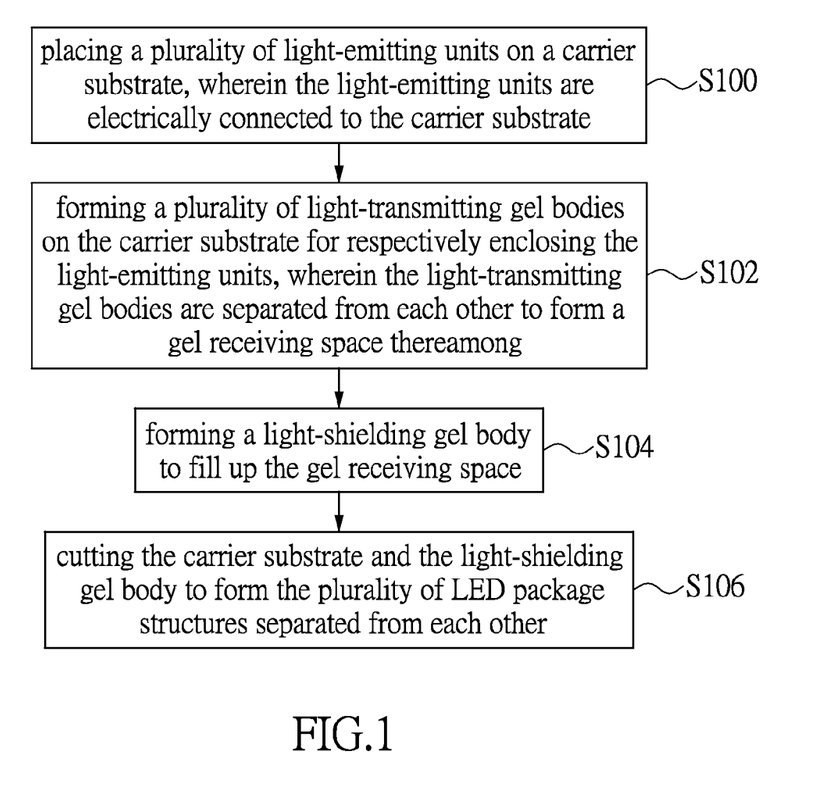
FIG. 1 shows a flowchart of the method of manufacturing a LED package structure for preventing lateral light leakage according to the first embodiment the instant disclosure.
Figure 2:
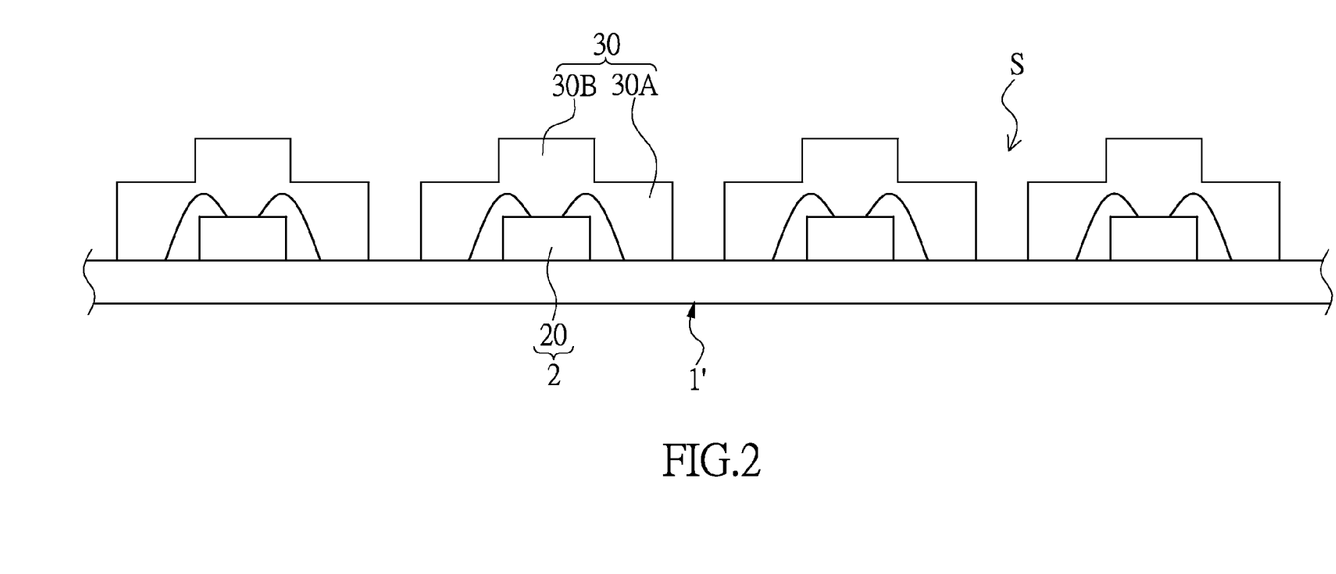
FIG. 2 shows a lateral, schematic view of the two manufacture steps S100 and S102 of the method of manufacturing a LED package structure for preventing lateral light leakage according to the first embodiment the instant disclosure.

Referring to FIG. 1 to FIG. 4, the first embodiment of the instant disclosure provides a method of manufacturing a LED package structure Z for preventing lateral light leakage, comprising the following steps:

Step S100 is: referring to FIG. 1 and FIG. 2, placing a plurality of light-emitting units 2 on a carrier substrate 1', wherein the light-emitting units 2 are electrically connected to the carrier substrate 1'. For example, each light-emitting unit 2 includes at least one LED chip 20, and the LED chip 20 is electrically connected to the carrier substrate 1' through two conductive lines (not shown).

Step S102 is: referring to FIG. 1 and FIG. 2, forming a plurality of light-transmitting gel bodies 30 on the carrier substrate 1' for respectively enclosing the light-emitting units 2, wherein the light-transmitting gel bodies 30 are separated from each other to form a gel receiving space S among the light-transmitting gel bodies 30. For example, the light-transmitting gel body 30 may be formed by a transparent material only or by uniformly mixing the transparent material with phosphor particles and/or diffusion particles. The light-transmitting gel bodies 30 are concurrently formed on the carrier substrate 1' to respectively enclose the LED chips 20 by compression molding. More precisely, each light-transmitting gel body 30 has a first light-transmitting portion 30A disposed on the carrier substrate 1' to enclose the at least one LED chip 20 of the corresponding light-emitting unit 2 and at least one second light-transmitting portion 30B projected upwardly from the first light-transmitting portion 30A and corresponding to the at least one LED chip 20 of the corresponding light-emitting unit 2.

Figure 3A:
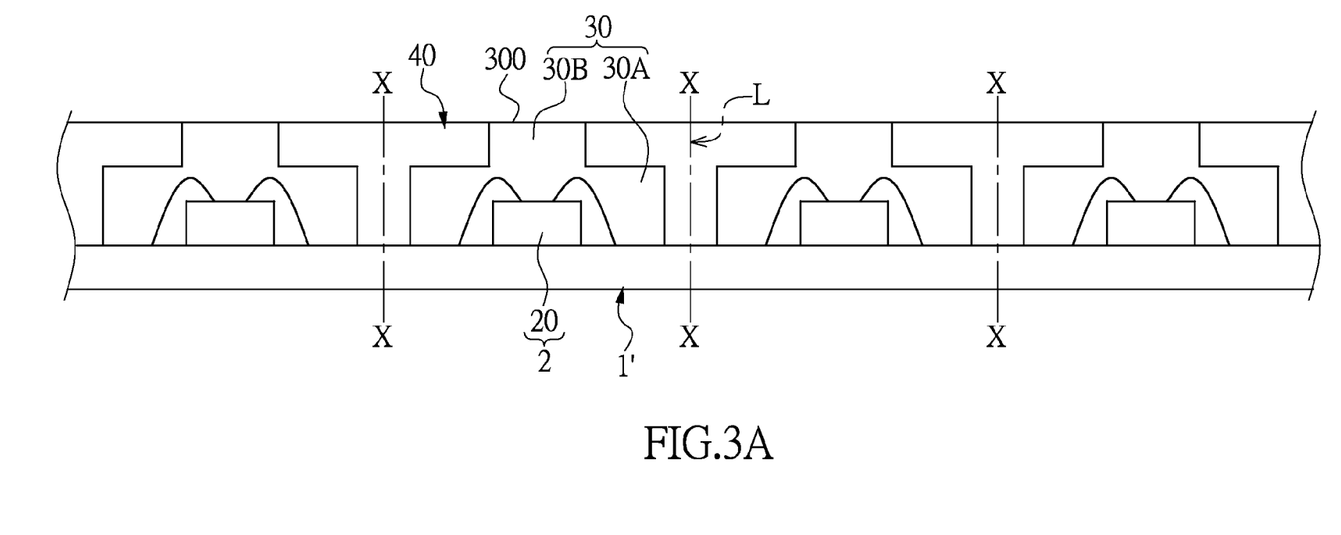
FIG. 3A shows a lateral, schematic view of the manufacture step S104 of the method of manufacturing a LED package structure for preventing lateral light leakage according to the first embodiment the instant disclosure.
Figure 3B:
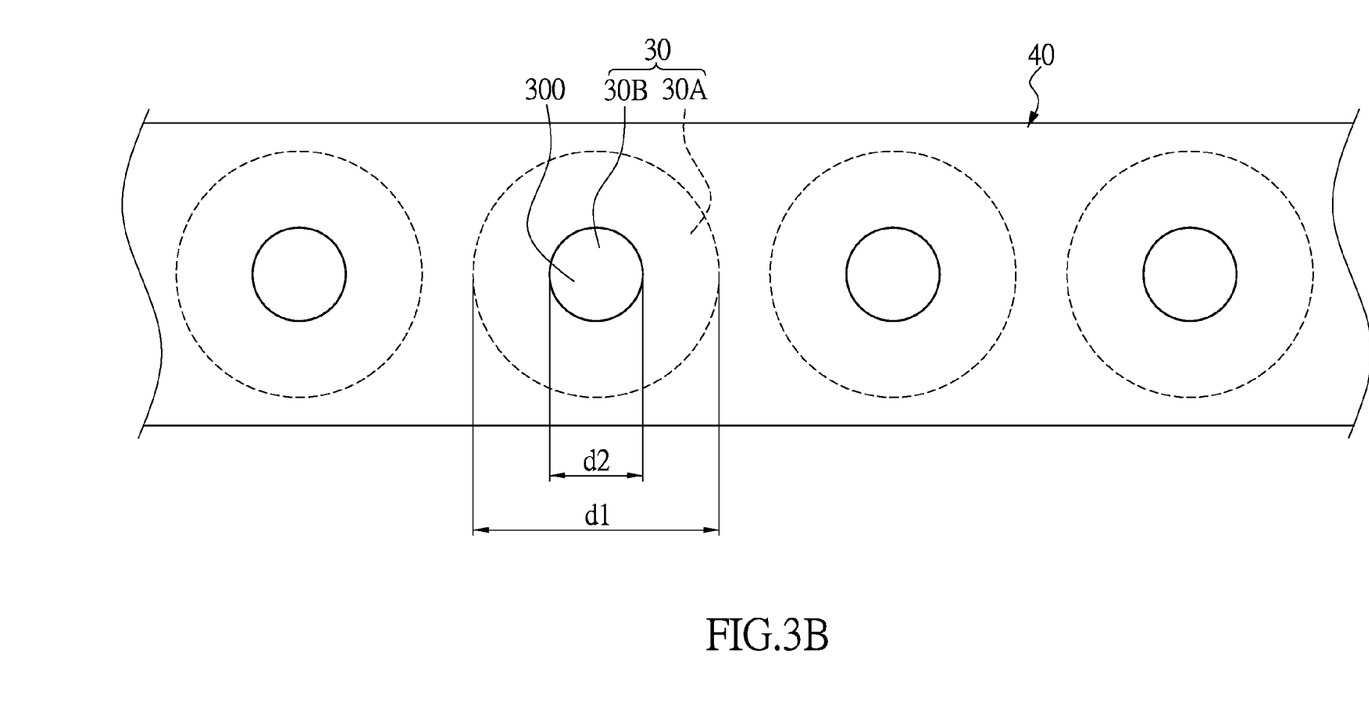
FIG. 3B shows a top, schematic view of the manufacture step S104 of the method of manufacturing a LED package structure for preventing lateral light leakage according to the first embodiment the instant disclosure.

Step S104 is: referring to FIG. 1, FIG. 2 and FIG. 3A, forming a light-shielding gel body 40 to fill up the gel receiving space S. More precisely, the gel receiving space S is filled with the light-shielding gel body 40, but the top side of each light-transmitting gel body 30 is exposed from the light-shielding gel body 40. For example, referring to FIG. 3A and FIG. 3B, the first light-transmitting portion 30A may be a first column body disposed on the carrier substrate 1' to enclose the at least one LED chip 20 of the corresponding light-emitting unit 2, and the at least one second light-transmitting portion 30B may be a second column body integrally and upwardly projected from the first light-transmitting portion 30A and disposed right above the at least one LED chip 20 of the corresponding light-emitting unit 2. In addition, the top side 300 of the second light-transmitting portion 30B may be a circular surface disposed right above the LED chip 20, and the diameter d2 of the at least one second light-transmitting portion 30B is smaller than the diameter d1 of the first light-transmitting portion 30A. It is worth noting that both the first light-transmitting portion 30A and the at least one second light-transmitting portion 30B are cylinders for example in this embodiment, but it is not meant to limit the instant disclosure.

Figure 4:
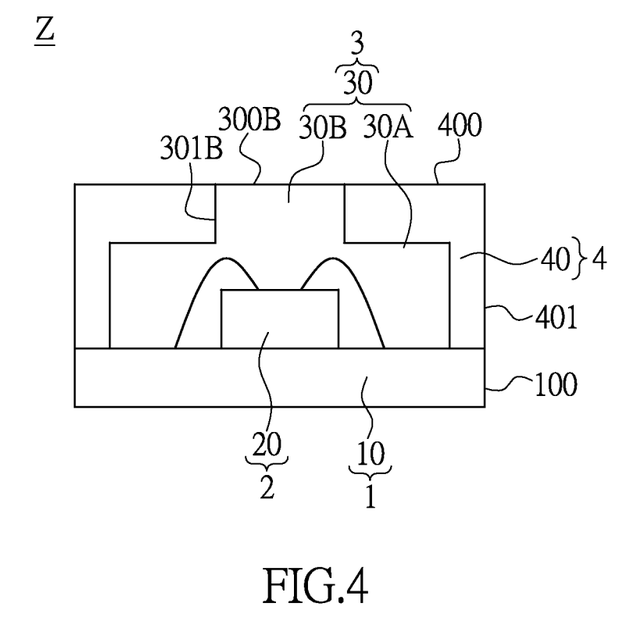
FIG. 4 shows a lateral, schematic view of the LED package structures for preventing lateral light leakage according to the first embodiment the instant disclosure.

Step S106 is: referring to FIG. 3A and FIG. 4, cutting the carrier substrate 1' and the light-shielding gel body 40 along the X-X cutting line of FIG. 3A to form the plurality of LED package structures Z separated from each other, wherein the carrier substrate 1' is cut to form a plurality of circuit substrates 10 for respectively carrying the light-emitting units 2.

In conclusion, due to the steps from S100 to S106, the first embodiment of the instant disclosure provides a LED package structure Z for preventing lateral light leakage, comprising: a substrate unit 1, a light-emitting unit 2, a light-transmitting unit 3 and a light-shielding unit 4. The substrate unit 1 includes a circuit substrate 10. The light-emitting unit 2 includes at least one LED chip 20 disposed on the circuit substrate 10 and electrically connected to the circuit substrate 10. The light-transmitting unit 3 includes a light-transmitting gel body 30 disposed on the circuit substrate 10 for enclosing the at least one LED chip 20, and the light-transmitting gel body 30 has a first light-transmitting portion 30A disposed on the circuit substrate 10 for enclosing the at least one LED chip 20 and at least one second light-transmitting portion 30B projected upwardly from the first light-transmitting portion 30A and corresponding to the at least one LED chip 20, and the at least one second light-transmitting portion 30B has a light output surface 300B and an outer perimeter surface 301B (such as an outer surrounding peripheral surface) connected between the light output surface 300B and the first light-transmitting portion 30A. The light-shielding unit 4 includes a light-shielding gel body 40 disposed on the circuit substrate 10 for exposing the light output surface 300B of the at least one second light-transmitting portion 30B. The first light-transmitting portion 30A and the outer perimeter surface 301B of the at least one second light-transmitting portion 30B are enclosed by the light-shielding gel body 40, and the light output surface 300B of the at least one second light-transmitting portion 30B is substantially flush with the top surface 400 of the light-shielding gel body 40. In another embodiment, the light output surface 300B of the at least one second light-transmitting portion 30B may be higher or lower than the top surface 400 of the light-shielding gel body 40, according to different requirements. It is worth mentioning that the outer perimeter surface 100 of the circuit substrate 10 may be substantially flush with the outer perimeter surface 401 of the light-shielding gel body 40.

Second Embodiment

Figure 5:
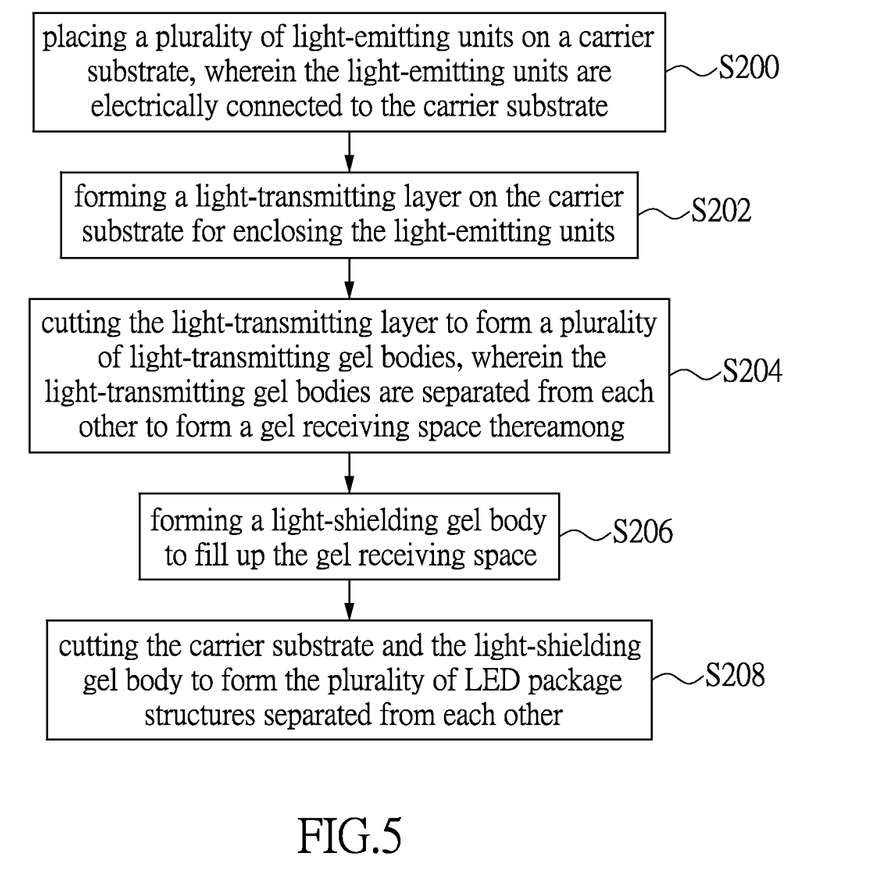
FIG. 5 shows a flowchart of the method of manufacturing a LED package structure for preventing lateral light leakage according to the second embodiment the instant disclosure.
Figure 6:
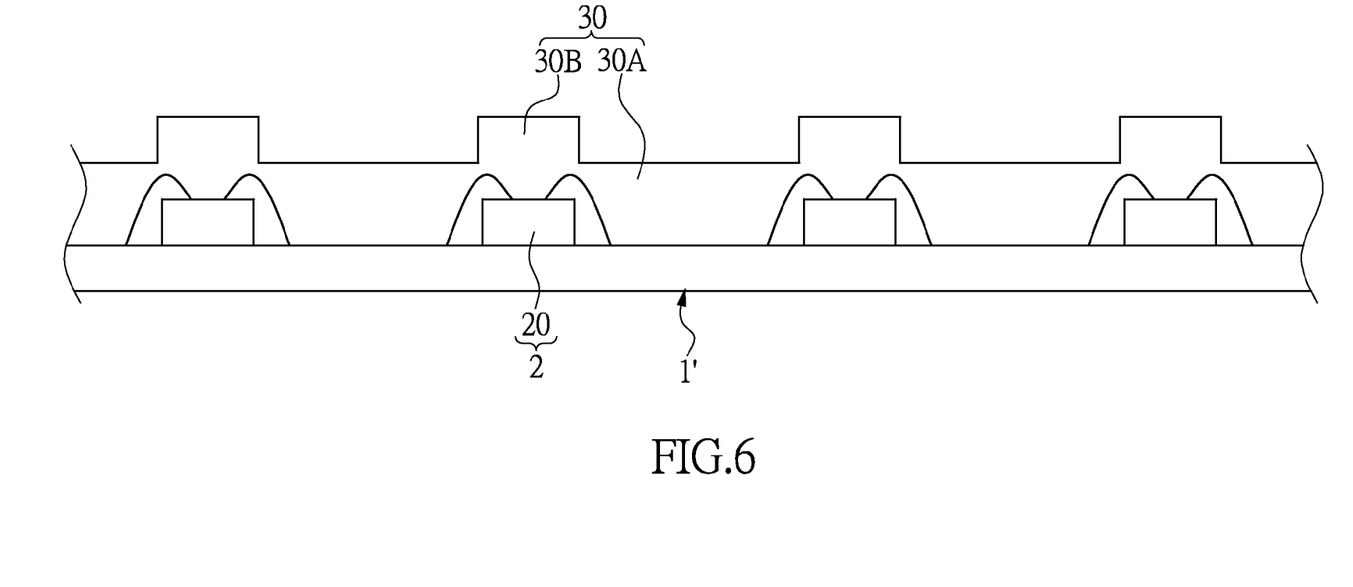
FIG. 6 shows a lateral, schematic view of the two manufacture steps S200 and S202 of the method of manufacturing a LED package structure for preventing lateral light leakage according to the second embodiment the instant disclosure.

Referring to FIG. 5 and FIG. 6, the second embodiment of the instant disclosure provides a method of manufacturing a LED package structure Z for preventing lateral light leakage comprising the steps from S200 to S208, and the step S200 and the steps from S206 to S208 are the same as the step S100 and the steps from S104 to S106. The difference between the second embodiment and the first embodiment is as follows:

Step S202 is: referring to FIG. 5 and FIG. 6, forming a light-transmitting layer (not labeled) on the carrier substrate 1' for enclosing the light-emitting units 2. For example, the light-transmitting layer may be formed by a transparent material only or by uniformly mixing the transparent material with phosphor particles and/or diffusion particles. The light-transmitting layer is formed on the carrier substrate 1' to respectively enclose the LED chips 20 by compression molding.

Step S204 is: referring to FIG. 5, FIG. 6 and FIG. 2, cutting the light-transmitting layer (not labeled) to form a plurality of light-transmitting gel bodies 30, wherein the light-transmitting gel bodies 30 are disposed on the carrier substrate 1' for respectively enclosing the light-emitting units 2, and the light-transmitting gel bodies 30 are separated from each other to form a gel receiving space S among the light-transmitting gel bodies 30. More precisely, each light-transmitting gel body 30 has a first light-transmitting portion 30A disposed on the carrier substrate 1' to enclose the at least one LED chip 20 of the corresponding light-emitting unit 2 and at least one second light-transmitting portion 30B projected upwardly from the first light-transmitting portion 30A and corresponding to the at least one LED chip 20 of the corresponding light-emitting unit 2. It is worth mentioning that the width of each light-transmitting gel body 30 can be defined by the cutting step of S204.

Third Embodiment

Figure 7:
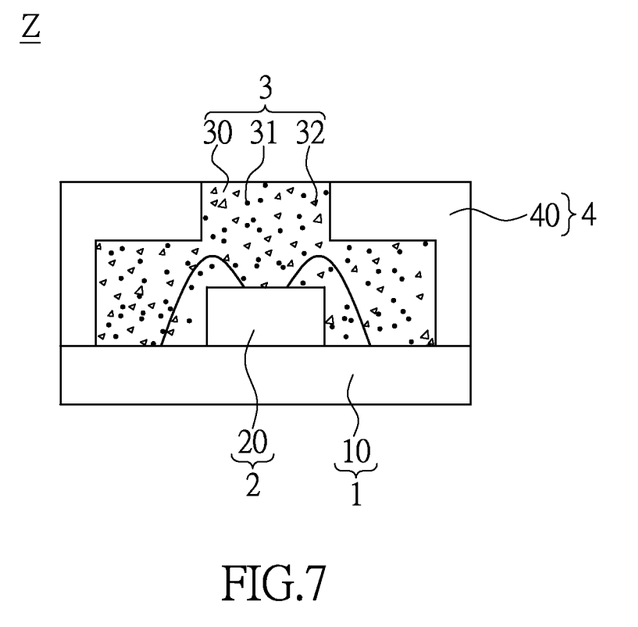
FIG. 7 shows a lateral, schematic view of the LED package structures for preventing lateral light leakage according to the third embodiment the instant disclosure.

Referring to FIG. 7, the third embodiment of the instant disclosure provides a LED package structure Z for preventing lateral light leakage, comprising: a substrate unit 1, a light-emitting unit 2, a light-transmitting unit 3 and a light-shielding unit 4. Comparing FIG. 7 with FIG. 4, the difference between the third embodiment and the other embodiments is as follows: in the third embodiment, light-transmitting unit 3 further includes a plurality of phosphor particles 31 uniformly mixed with the light-transmitting gel body 30 and a plurality of diffusion particles 32 uniformly mixed with the light-transmitting gel body 30, and the light-emitting efficiency of the instant disclosure is increased by using the diffusion particles 32. In other words, the light-transmitting gel body 30 may be formed by a transparent material (such as epoxy or silicone) only or by uniformly mixing the transparent material with the phosphor particles 31 and the diffusion particles 32.

Fourth Embodiment

Figure 8A:
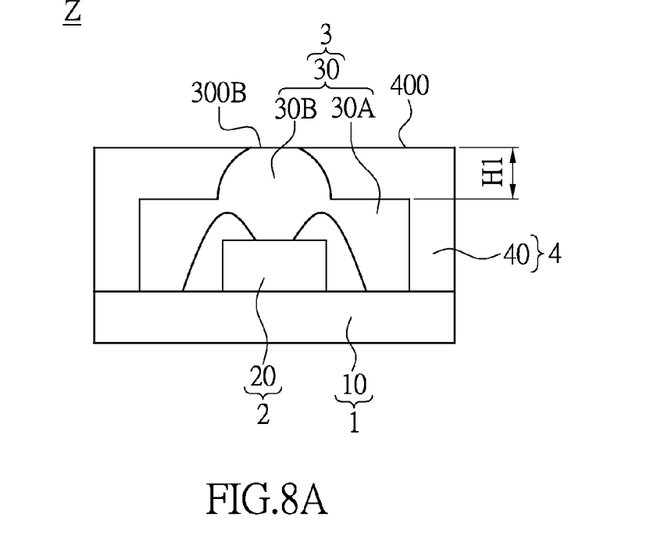
FIG. 8A shows a lateral, schematic view of the LED package structures providing a light output surface having a d5 diameter according to the fourth embodiment the instant disclosure.
Figure 8B:
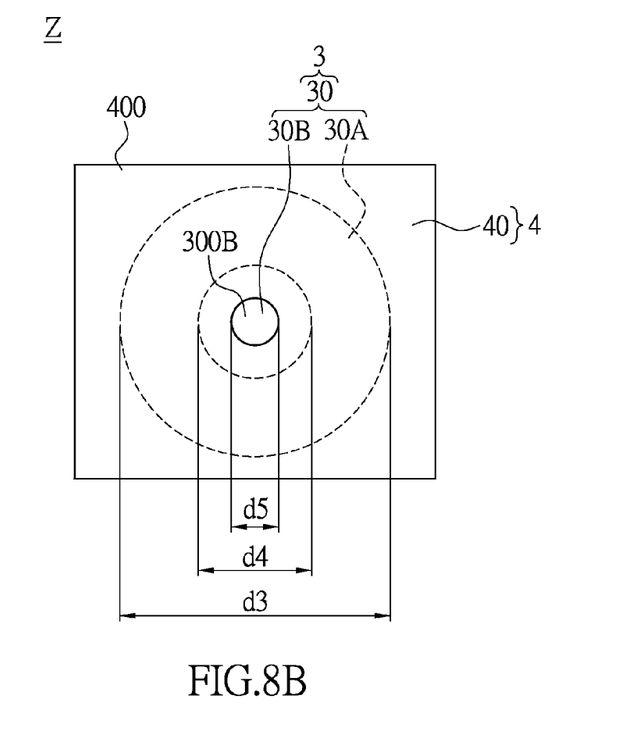
FIG. 8B shows a top, schematic view of the LED package structures providing a light output surface having a d5 diameter according to the fourth embodiment the instant disclosure.
Figure 9A:
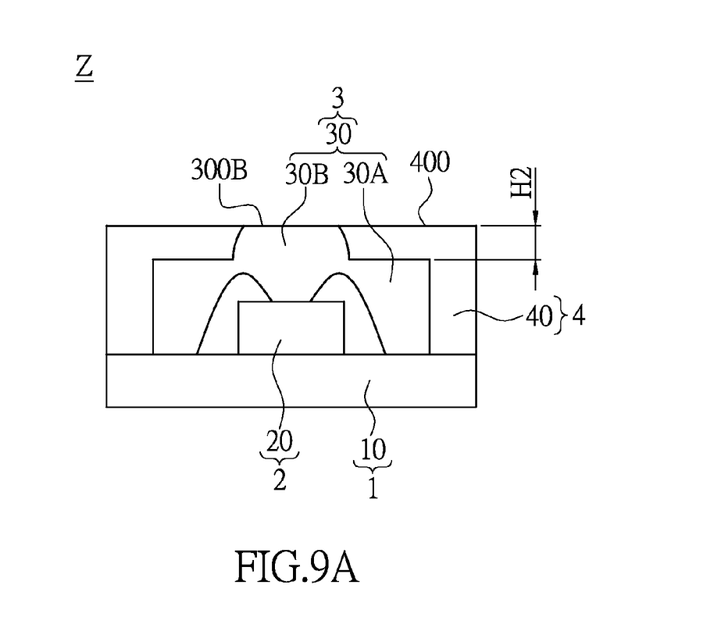
FIG. 9A shows a lateral, schematic view of the LED package structures providing a light output surface having a d6 diameter according to the fourth embodiment the instant disclosure.
Figure 9B:
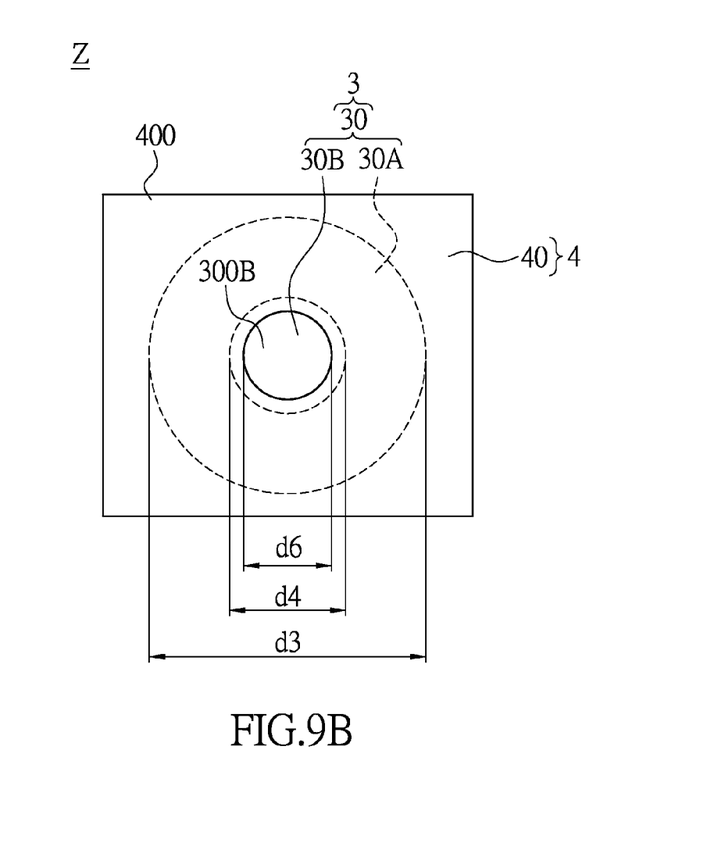
FIG. 9B shows a top, schematic view of the LED package structures providing a light output surface having a d6 diameter according to the fourth embodiment the instant disclosure.

Referring to FIG. 8A to FIG. 9B, the fourth embodiment of the instant disclosure provides a LED package structure Z for preventing lateral light leakage, comprising: a substrate unit 1, a light-emitting unit 2, a light-transmitting unit 3 and a light-shielding unit 4. The difference between the fourth embodiment and the other embodiments is as follows: in the fourth embodiment, the diameter of the at least one second light-transmitting portion 30B is decreased gradually along a direction from the first light-transmitting portion 30A to the light output surface 300B of the at least one second light-transmitting portion 30B. The maximum diameter d4 of the at least one second light-transmitting portion 30B is smaller than the diameter d3 of the first light-transmitting portion 30A, and the minimum diameters (d5, d6) of the light output surface 300B of the at least one second light-transmitting portion 30B varies inversely as the heights (H1, H2) from the top surface 400 of the light-shielding gel body 40 to the first light-transmitting portion 30A, respectively. For example, when the height from the top surface 400 of the light-shielding gel body 40 to the first light-transmitting portion 30A is ground from H1 (as shown in FIG. 8A) into H2 (as shown in FIG. 9A), the diameter of the light output surface 300B of the at least one second light-transmitting portion 30B is increased from d5 to d6. In other words, the minimum diameters (d5, d6) of the light output surface 300B of the at least one second light-transmitting portion 30B can be adjusted or changed according to different requirements.

It is worth mentioning that the diameter of the at least one second light-transmitting portion 30B can be increased gradually along a direction from the first light-transmitting portion 30A to the light output surface 300B of the at least one second light-transmitting portion 30B, and the maximum diameter d4 of the at least one second light-transmitting portion 30B is bigger than the diameter d3 of the first light-transmitting portion 30A. In addition, for especial application, the diameter d4 of the at least one second light-transmitting portion 30B may be substantially the same as the diameter d3 of the first light-transmitting portion 30A. In other words, the light output angle and the light output range of the light-emitting unit 2 can be changed by adjusting the diameters (d5, d6) of the light output surface 300B of the at least one second light-transmitting portion 30B.

Fifth Embodiment

Figure 10:
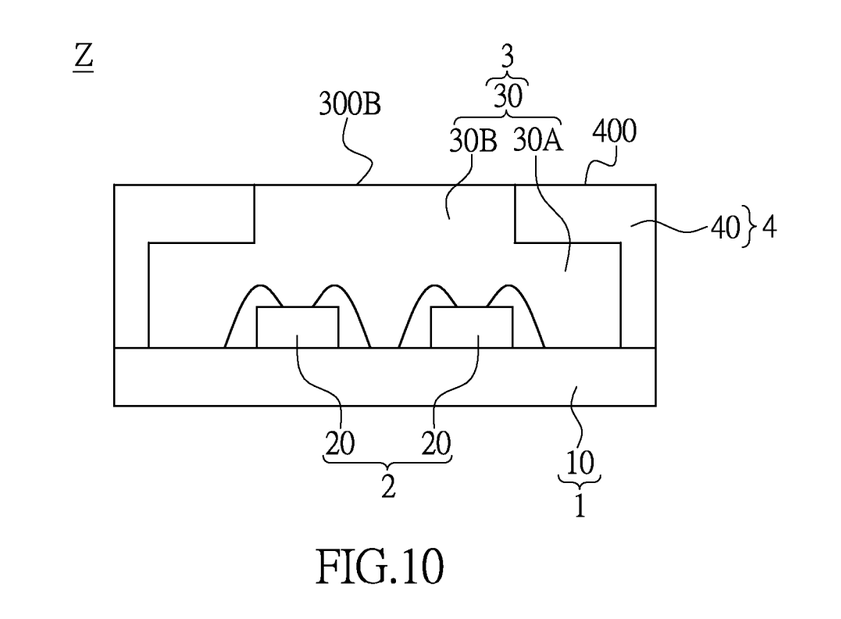
FIG. 10 shows a lateral, schematic view of the LED package structures for preventing lateral light leakage according to the fifth embodiment the instant disclosure.

Referring to FIG. 10, the fifth embodiment of the instant disclosure provides a LED package structure Z for preventing lateral light leakage, comprising: a substrate unit 1, a light-emitting unit 2, a light-transmitting unit 3 and a light-shielding unit 4. The difference between the fifth embodiment and the other embodiments is as follows: in the fifth embodiment, the light-emitting unit 2 includes a plurality of LED chips 20 disposed on the circuit substrate 10 and electrically connected to the circuit substrate 10. Hence, the single LED package structure Z is composed of the circuit substrate 10, the LED chips 20 disposed on the circuit substrate 10 and electrically connected to the circuit substrate 10, the light-transmitting gel body 30 disposed on the circuit substrate 10 for enclosing the plurality of LED chips 20 (the light-transmitting gel body 30 has a first light-transmitting portion 30A and a second light-transmitting portion 30B), and the light-shielding gel body 40 disposed on the circuit substrate 10 for exposing the light output surface 300B of the second light-transmitting portion 30B. It is worth mentioning that when the single LED package structure Z is applied to an LED display using a RGB LED chip array, the light-transmitting gel body 30 is mixed with the phosphor particles, thus the light-emitting unit 2 can generate white light through the light-transmitting gel body 30 with the phosphor particles. In another embodiment, the light output surface 300B of the at least one second light-transmitting portion 30B may be higher or lower than the top surface 400 of the light-shielding gel body 40, according to different requirements.

Sixth Embodiment

Figure 11:
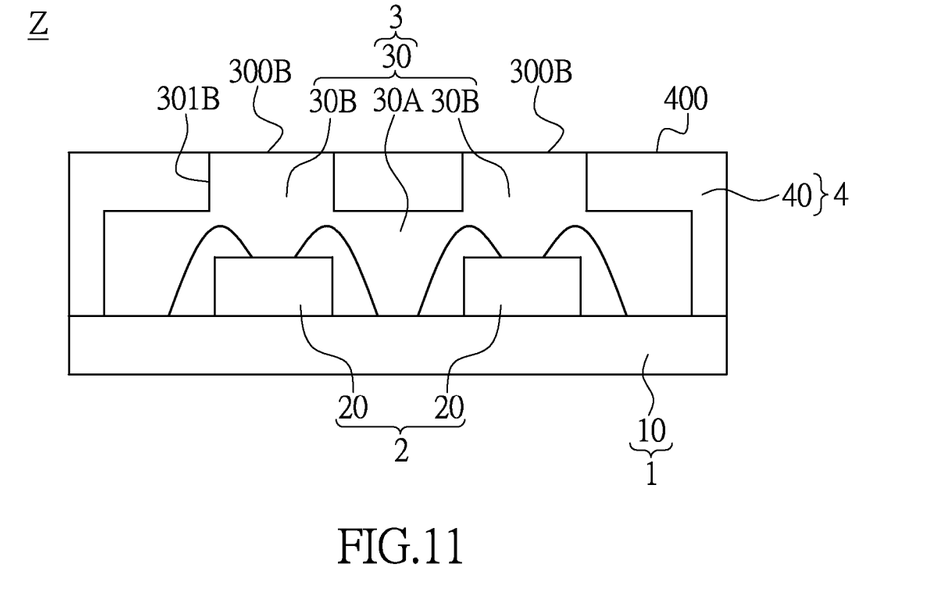
FIG. 11 shows a lateral, schematic view of the LED package structures for preventing lateral light leakage according to the sixth embodiment the instant disclosure.

Referring to FIG. 11, the sixth embodiment of the instant disclosure provides a LED package structure Z for preventing lateral light leakage, comprising: a substrate unit 1, a light-emitting unit 2, a light-transmitting unit 3 and a light-shielding unit 4. The substrate unit 1 includes a circuit substrate 10. The light-emitting unit 2 includes a plurality of LED chips 20 disposed on the circuit substrate 10 and electrically connected to the circuit substrate 10. The light-transmitting unit 3 includes a light-transmitting gel body 30 disposed on the circuit substrate 10 for enclosing the plurality of LED chips 20, and the light-transmitting gel body 30 has a first light-transmitting portion 30A disposed on the circuit substrate 10 for enclosing the plurality of LED chip 20 and a plurality of second light-transmitting portions 30B projected upwardly from the first light-transmitting portion 30A and respectively corresponding to the LED chips 20, and each of the second light-transmitting portions 30B has a light output surface 300B and an outer perimeter surface 301B (such as an outer surrounding peripheral surface) connected between the light output surface 300B and the first light-transmitting portion 30A. The light-shielding unit 4 includes a light-shielding gel body 40 disposed on the circuit substrate 10 for exposing the light output surface 300B of each second light-transmitting portion 30B. The first light-transmitting portion 30A and the outer perimeter surface 301B of each second light-transmitting portion 30B are enclosed by the light-shielding gel body 40, and the light output surface 300B of each second light-transmitting portion 30B is substantially flush with the top surface 400 of the light-shielding gel body 40. In another embodiment, the light output surface 300B of each second light-transmitting portion 30B may be higher or lower than the top surface 400 of the light-shielding gel body 40, according to different requirements.

Seventh Embodiment

Figure 12:
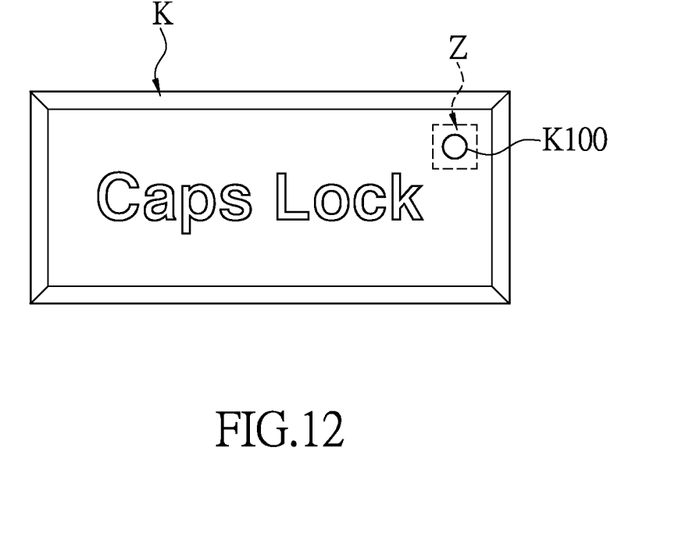
FIG. 12 shows a top, schematic view of the LED package structures for preventing lateral light leakage disposed under a predetermined key cap according to the seventh embodiment the instant disclosure.

Referring to FIG. 4 and FIG. 12, the seventh embodiment of the instant disclosure provides a LED package structure Z applied to a predetermined key cap K. The LED package structure Z is disposed under the predetermined key cap K, and the predetermined key cap K has at least one light-transmitting opening K100 (such as a solid transparent body or an empty hole) corresponding to the light output surface 300B of the second light-transmitting portion 30B. For example, the predetermined key cap K may be a Caps Lock key. When the user presses the predetermined key cap K, light beams generated by the LED chip 20 of the LED package structure Z pass through the at least one light-transmitting opening K100 and project out of the predetermined key cap K to form an indication light for the user. Hence, it is convenient for the user to determine that whether the function of the predetermined key cap K is turned on or not.

In conclusion, the instant disclosure can provide a LED package structure Z for preventing lateral light leakage and a method of manufacturing the same due to the design of "the light-shielding gel body 40 disposed on the circuit substrate 10 for exposing the light output surface 300B of the at least one second light-transmitting portion 30B" or "the light-shielding gel body 40 disposed on the circuit substrate 10 for exposing the light output surface 300B of each second light-transmitting portion 30B".

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A method of manufacturing a LED package structure for preventing lateral light leakage, comprising:
   placing a plurality of light-emitting units on a carrier substrate, wherein the light-emitting units are electrically connected to the carrier substrate;
   forming a plurality of light-transmitting gel bodies on the carrier substrate for respectively enclosing the light-emitting units, wherein the light-transmitting gel bodies are separated from each other to form a gel receiving space among the light-transmitting gel bodies;
   forming a light-shielding gel body to fill up the gel receiving space; and
   cutting the carrier substrate and the light-shielding gel body to form the plurality of LED package structures separated from each other, wherein the carrier substrate is cut to form a plurality of circuit substrates for respectively carrying the light-emitting units.

2. The method of claim 1, wherein each light-emitting unit includes at least one LED chip, each light-transmitting gel body has a first light-transmitting portion disposed on the corresponding circuit substrate for enclosing the at least one LED chip of the corresponding light-emitting unit and at least one second light-transmitting portion projected upwardly from the first light-transmitting portion and corresponding to the at least one LED chip of the corresponding light-emitting unit, and the at least one second light-transmitting portion has a light output surface on the top side of the light-transmitting gel body and an outer perimeter surface connected between the light output surface and the first light-transmitting portion, wherein the first light-transmitting portion and the outer perimeter surface of the at least one second light-transmitting portion of each light-transmitting gel body are enclosed by the light-shielding gel body, and the light output surface of the at least one second light-transmitting portion is higher than, lower than or substantially flush with the top surface of the light-shielding gel body.

3. The method of claim 2, wherein the first light-transmitting portion is a first column body disposed on the corresponding circuit substrate for enclosing the at least one LED chip of the corresponding light-emitting unit, the at least one second light-transmitting portion is a second column body integrally and upwardly projected from the first light-transmitting portion and disposed right above the at least one LED chip of the corresponding light-emitting unit, and the diameter of the at least one second light-transmitting portion is increased or decreased gradually along a direction from the first light-transmitting portion to the light output surface of the at least one second light-transmitting portion.

4. The method of claim 1, wherein the circuit substrate has an outer perimeter, the light-shielding gel body has an outer perimeter, and the outer perimeter surface of the circuit substrate is substantially flush with the outer perimeter surface of the light-shielding gel body, wherein the light-transmitting gel body is formed by a transparent material only or by uniformly mixing the transparent material with phosphor particles and diffusion particles.

5. A method of manufacturing a LED package structure for preventing lateral light leakage, comprising:
    placing a plurality of light-emitting units on a carrier substrate, wherein the light-emitting units are electrically connected to the carrier substrate;
    forming a light-transmitting layer on the carrier substrate for enclosing the light-emitting units;
    cutting the light-transmitting layer to form a plurality of light-transmitting gel bodies, wherein the light-transmitting gel bodies are disposed on the carrier substrate for respectively enclosing the light-emitting units, and the light-transmitting gel bodies are separated from each other to form a gel receiving space among the light-transmitting gel bodies;
    forming a light-shielding gel body to fill up the gel receiving space; and
    cutting the carrier substrate and the light-shielding gel body to form the plurality of LED package structures separated from each other, wherein the carrier substrate is cut to form a plurality of circuit substrates for respectively carrying the light-emitting units.

6. The method of claim 5, wherein each light-emitting unit includes at least one LED chip, each light-transmitting gel body has a first light-transmitting portion disposed on the corresponding circuit substrate for enclosing the at least one LED chip of the corresponding light-emitting unit and at least one second light-transmitting portion projected upwardly from the first light-transmitting portion and corresponding to the at least one LED chip of the corresponding light-emitting unit, and the at least one second light-transmitting portion has a light output surface on the top side of the light-transmitting gel body and an outer perimeter surface connected between the light output surface and the first light-transmitting portion, wherein the first light-transmitting portion and the outer perimeter surface of the at least one second light-transmitting portion of each light-transmitting gel body are enclosed by the light-shielding gel body, and the light output surface of the at least one second light-transmitting portion is higher than, lower than or substantially flush with the top surface of the light-shielding gel body.

7. The method of claim 6, wherein the first light-transmitting portion is a first column body disposed on the corresponding circuit substrate for enclosing the at least one LED chip of the corresponding light-emitting unit, the at least one second light-transmitting portion is a second column body integrally and upwardly projected from the first light-transmitting portion and disposed right above the at least one LED chip of the corresponding light-emitting unit, and the diameter of the at least one second light-transmitting portion is increased or decreased gradually along a direction from the first light-transmitting portion to the light output surface of the at least one second light-transmitting portion.

8. The method of claim 5, wherein the circuit substrate has an outer perimeter, the light-shielding gel body has an outer perimeter, and the outer perimeter surface of the circuit substrate is substantially flush with the outer perimeter surface of the light-shielding gel body, wherein the light-transmitting gel body is formed by a transparent material only or by uniformly mixing the transparent material with phosphor particles and diffusion particles.

\* \* \* \* \*